US006935236B2

(12) United States Patent
Hiller et al.

(10) Patent No.: US 6,935,236 B2
(45) Date of Patent: Aug. 30, 2005

(54) METHOD FOR PRODUCING FLEXOGRAPHIC PRINTING PLATES BY MEANS OF LASER ENGRAVING

(75) Inventors: Margit Hiller, Karlstadt (DE); Jens Schadebrodt, Mainz (DE); Jürgen Kaczun, Wachenheim (DE); Dieter Niederstadt, Holzwickede (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 10/380,050

(22) PCT Filed: Mar. 16, 2002

(86) PCT No.: PCT/EP02/02954

§ 371 (c)(1),
(2), (4) Date: Mar. 11, 2003

(87) PCT Pub. No.: WO02/076739

PCT Pub. Date: Oct. 3, 2002

(65) Prior Publication Data

US 2004/0089180 A1 May 13, 2004

(51) Int. Cl.[7] .......................... B41C 1/05; G03F 7/075
(52) U.S. Cl. .................................. 101/401.1; 430/306
(58) Field of Search ............................... 101/150, 395, 101/401.1, 467, 487; 430/270.1, 306, 307

(56) References Cited

U.S. PATENT DOCUMENTS 4,579,806 A * 4/1986 Schupp et al. ........... 430/280.1
5,259,311 A 11/1993 McCaughey, Jr. ........ 101/401.1
5,798,202 A * 8/1998 Cushner et al. ............. 430/306
5,804,353 A * 9/1998 Cushner et al. ............. 430/306
6,511,784 B1 * 1/2003 Hiller et al. ............. 430/270.1
2002/0018958 A1 2/2002 Nishioka et al. ............ 430/302
2002/0123003 A1 * 9/2002 Kannurpatti et al. ..... 430/270.1

FOREIGN PATENT DOCUMENTS

| | | | |
|---|---|---|---|
| EP | 640 043 | | 1/1996 |
| EP | 640 044 | | 3/1996 |
| EP | 1080883 | * | 3/2001 |
| EP | 1 167 025 | | 1/2002 |

OTHER PUBLICATIONS

U.S. Appl. No. 60/254,163.*

Technik des Flexodrucks, S. 173ff., 4.Auflage; 1991, Coatings Verlag, St. Gallen, Schweiz.

* cited by examiner

*Primary Examiner*—Stephen R. Funk
(74) *Attorney, Agent, or Firm*—Novak Druce & Quigg, LLP

(57) ABSTRACT

The invention relates to a method for producing flexographic printing forms by engraving a printing relief on a flexographic printing element that can be laser engraved, said element having a photochemically cross-linked relief layer. The relief layer is transparent and comprises oxidic, siliceous or zeolitic solid matter with a particle size between 1 and 400 nm in a quantity of between 0.1 and 8 wt. % in relation to the quantity of all components in the relief layer.

3 Claims, 2 Drawing Sheets

Flexographic printing plate according to Example 2 with
With 1 % of Aerosil after laser engraving

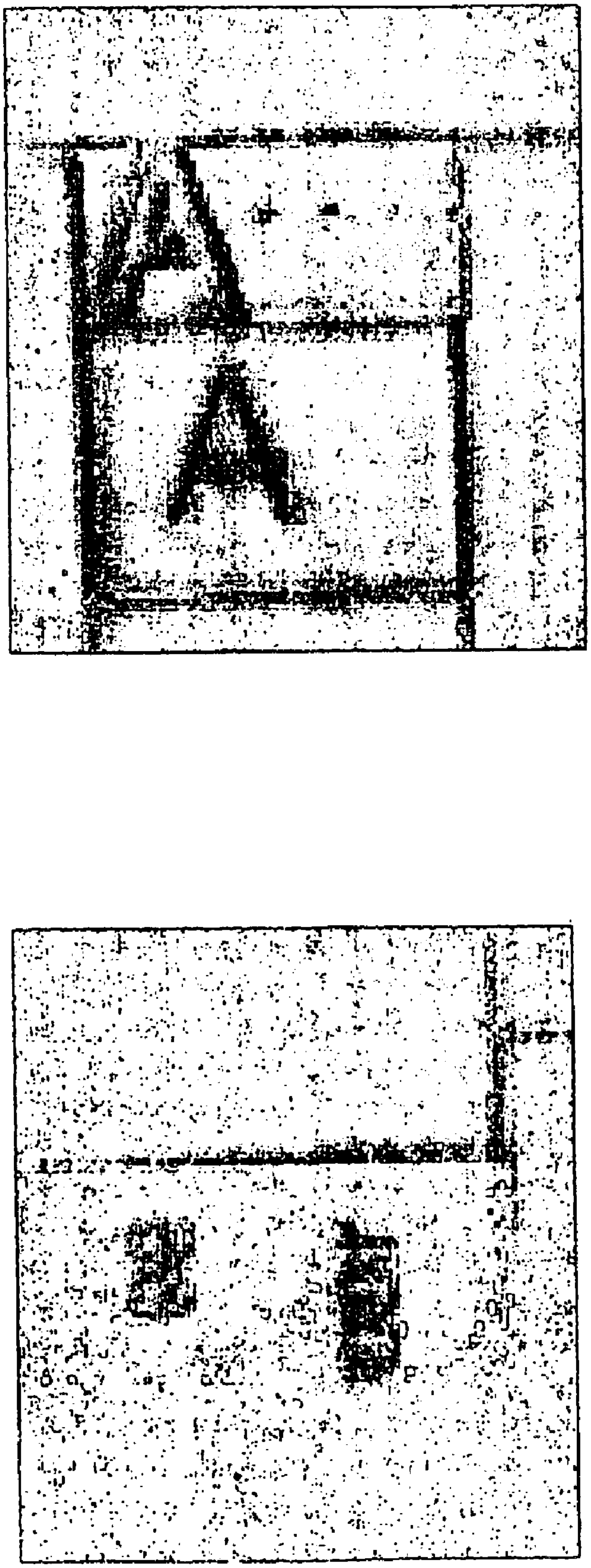
Figure 1: Flexographic printing plate according to Example 1 without filler after laser engraving

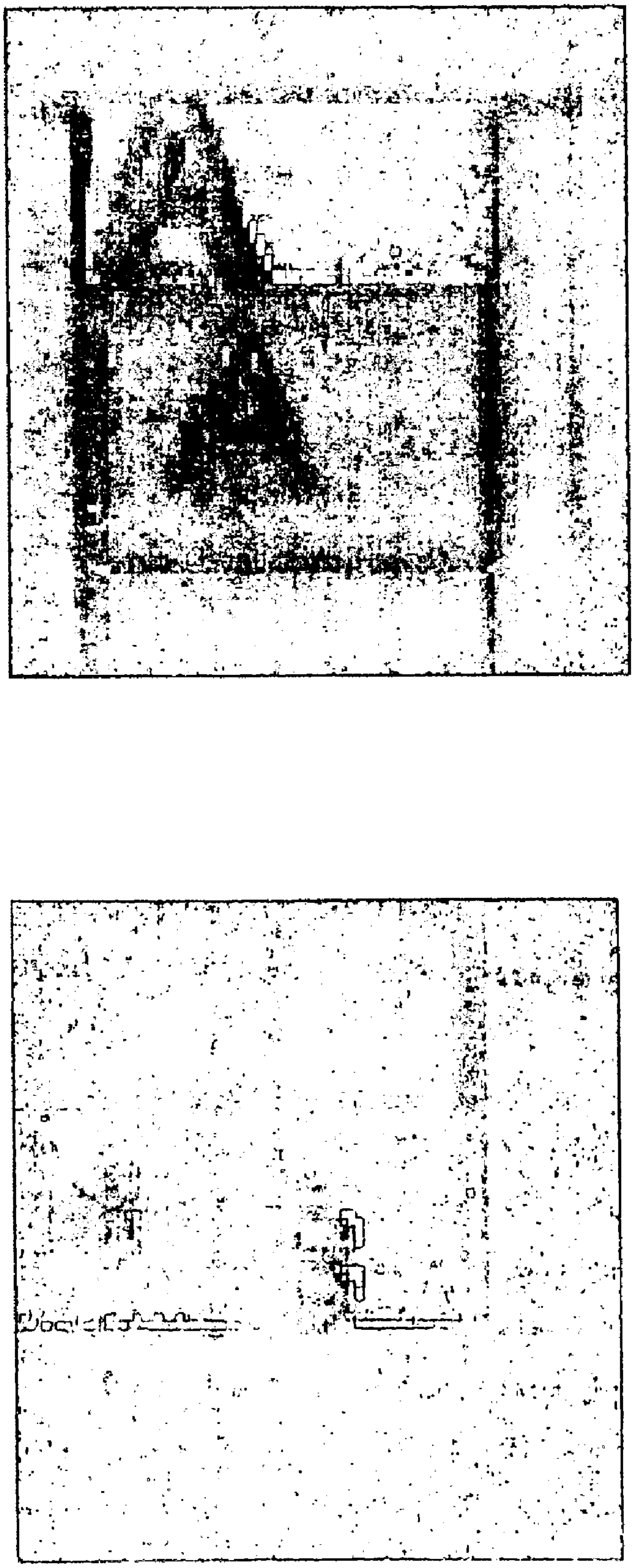
Figure 2: Flexographic printing plate according to Example 2 with With 1 % of Aerosil after laser engraving

METHOD FOR PRODUCING FLEXOGRAPHIC PRINTING PLATES BY MEANS OF LASER ENGRAVING

BACKGROUND OF THE INVENTION

The present invention relates to a process for the production of flexographic printing plates by engraving a printing relief into a laser-engravable flexographic printing element which has a photochemically crosslinked relief layer, where the relief layer is transparent and comprises an oxide, silicate or zeolite solid having a particle size of from 1 to 400 nm in an amount of from 0.1 to 8% by weight, based on the amount of all components of the relief layer.

In the technique of laser direct engraving for the production of flexographic printing plates, a relief which is suitable for printing is engraved directly into a relief layer which is suitable for this purpose. Although the engraving of rubber printing cylinders by means of lasers has in principle been known since the end of the 1960s, this technique has, however, only achieved broader commercial interest in recent years with the appearance of improved laser systems. The improvements in the laser systems include better focusability of the laser beam, higher power and computer-controlled beam guidance.

Laser direct engraving has a number of advantages over the conventional production of flexographic printing plates. A number of time-consuming process steps, such as the production of a photographic negative, and development and drying of the printing plate, can be omitted. Furthermore, the edge shape of the individual relief elements can be designed individually in the laser engraving technique. While the edges of a relief dot in photopolymer plates diverge continuously from the surface to the relief floor, laser engraving also enables the engraving of an edge which drops off vertically or almost vertically in the upper region and only spreads out in the lower region. Thus, at most slight dot gain, or none at all, takes place, even with increasing wear of the plate during the printing process. Further details on the technique of laser engraving are given, for example, in "Technik des Flexodrucks", pp. 173 ff., 4th Edn., 1999, Coating Verlag, St. Gallen, Switzerland.

EP-B 640 043 and EP-B 640 044 disclose single-layered or multilayered elastomeric laser-engravable recording elements for the production of flexographic printing plates. The elements consist of "reinforced" elastomeric layers. The layer is produced using elastomeric binders, in particular thermoplastic elastomers, for example SBS, SIS or SEBS block copolymers. The reinforcement increases the mechanical strength of the layer. The reinforcement is achieved by means of certain fillers, by photochemical or thermochemical crosslinking or by combinations thereof. The job of the reinforcing fillers is to improve the mechanical properties of the laser-engravable recording elements, for example the tensile strength, rigidity or abrasiveness. Relatively large amounts of fillers are necessary for this purpose. The examples in EP-B 640 043 disclose the addition of from 10 to 25% by weight of carbon black, based on the sum of all components of the layer, as reinforcing filler.

Said recording materials may in addition also comprise strongly colored pigments or dyes as IR absorbers in order to increase the sensitivity to laser radiation. Carbon black has a double function and acts both as IR absorber and as reinforcing filler.

The use of strongly colored IR absorbers results in substantially opaque layers. Layers of this type can no longer be crosslinked photochemically as a whole, since the penetration depth of the actinic radiation is restricted owing to the very strong absorption. As a solution, EP-B 640 043 proposes producing a thick layer by casting a multiplicity of thin layers, in each case followed by photochemical crosslinking of each individual layer. However, this procedure is inconvenient, expensive and also makes other production plants necessary.

It is, however, in principle also possible to produce flexographic printing plates by laser engraving using commercially available photopolymerizable flexographic printing elements without IR absorbers. The sensitivity of conventional elastomeric binders to $CO_2$ lasers (wavelength about 10 $\mu$m) is generally adequate for laser engraving. U.S. Pat. No. 5,259,311 discloses a process in which, in a first step, a conventional flexographic printing element is photochemically crosslinked by irradiation over the entire surface, and, in a second step, a printing relief is engraved by means of a laser.

The use of conventional flexographic printing elements for laser engraving has the major advantage that new production plants for a novel product line are not necessary, it being possible instead to use the existing plants.

However, a number of technical problems still remain to be solved in laser engraving of conventional flexographic printing elements.

In the ideal case, the relief layers of laser-engravable flexographic printing elements should not melt during the laser engraving, but instead direct transition of the degradation products into the gas phase should take place if at all possible. Prior melting of the layer is disadvantageous: melt edges may form around engraved recesses, and the edges of the relief elements become less sharp. Flexographic printing plates having irregularities of this type give prints of lower quality than do printing plates without such irregularities.

However, the relatively soft relief layers of conventional flexographic printing plates, in particular those comprising thermoplastic elastomers as binder, have a strong tendency to form melt edges during laser engraving.

Furthermore, the resolution of flexographic printing plates of this type is frequently unsatisfactory. In practice, the lines engraved by the laser are much broader than actually desired, with the consequence that two closely adjacent recesses which should in fact remain separate from one another through a center web coincide to give a single recess.

BRIEF SUMMARY OF THE INVENTION

It is an object of the present invention to provide an improved process for the production of flexographic printing plates by laser engraving which enables the occurrence of melt edges to be avoided and significantly higher resolution to be achieved. It should be possible to produce the flexographic printing elements used as starting material for the process in the same production plants as conventional flexographic printing elements.

We have found, surprisingly, that this object is achieved by the addition of finely divided oxide, silicate or zeolite fillers to laser-engravable flexographic printing elements, whose resolving power can be considerably improved, and at the same time the occurrence of melt edges is also avoided. It was also particularly surprising and unexpected to the person skilled in the art that even small amounts of said fillers are sufficient to achieve the outlined effect.

Accordingly, we have found a process for the production of transparent flexographic printing plates by engraving a printing relief into a laser-engravable flexographic printing element which has a transparent relief layer obtained by photochemical crosslinking, where the relief layer comprises from 0.1 to 8% by weight, preferably from 0.2 to 5% by weight, of an oxide, silicate or zeolite solid having a particle size of from 1 to 400 nm.

The following details apply to the invention:

BRIEF DESCRIPTION OF THE SEVERAL VIEWS OF THE DRAWINGS

FIG. 1 shows a flexographic printing plate without filler after laser engraving.

FIG. 2 shows a flexographic printing plate with 1% of a finely divided pyrogenic silicon dioxide after laser engraving.

DETAILED DESCRIPTION OF THE INVENTION

The process according to the invention is carried out using a flexographic printing element which has at least one transparent and laser-engravable elastomeric layer which has been applied to a dimensionally stable support and has been photochemically crosslinked.

The term "laser-engravable" is taken to mean that the relief layer has the property of absorbing laser radiation, in particular the radiation of an IR laser, so that it is removed or at least loosened at points at which it is exposed to a laser beam of adequate intensity. The layer is preferably evaporated or thermally or oxidatively decomposed in the process without previously melting, so that its decomposition products are removed from the layer in the form of hot gases, vapors, fumes or small particles.

The term "transparent" is taken to mean that the relief layer of the laser-engravable element is substantially just as transparent as conventional photopolymerizable flexographic printing plates, i.e. underlying structures can be recognized with the naked eye. This does not exclude the possibility of the plate being colored to a certain extent.

Examples of suitable dimensionally stable supports are, in particular; foils made of metals, such as steel, aluminum, copper or nickel, or films made of plastic, such as polyethylene terephthalate (PET), polyethylene naphthalate (PEN), polybutylene terephthalate, polyamide or polycarbonate. Particularly suitable dimensionally stable supports are dimensionally stable polyester films, in particular PET or PEN films, or alternatively thin, flexible supports made of aluminum or stainless steel. The supports employed may also be conical or cylindrical tubes made from said materials, so-called sleeves. Glass fiber fabric or composite materials made from glass fibers and suitable polymeric materials are also suitable for sleeves.

For better adhesion of the laser-engravable layer, the dimensionally stable support may be coated with a suitable adhesive layer.

The transparent, laser-engravable layer comprises at least one elastomeric binder. Suitable elastomeric binders for the laser-engravable layer are, in particular, polymers which contain copolymerized 1,3-diene monomers, such as isoprene or butadiene. Depending on the nature of incorporation of the monomers, binders of this type contain crosslinkable olefin groups as a constituent of the main chain (1,4 incorporation) or as a side group (1,2 incorporation). Examples which may be mentioned are natural rubber, polybutadiene, polyisoprene, styrene-butadiene rubber, nitrile-butadiene rubber, butyl rubber, styrene-isoprene rubber, polynorbornene rubber and ethylene-propylene-diene rubber (EPDM).

However, it is in principle also possible to employ ethylene-propylene, ethylene-acrylate, ethylene-vinyl acetate or acrylate rubbers. Also suitable are hydrogenated rubbers and elastomeric polyurethanes. It is also possible to employ modified binders in which crosslinkable groups are introduced into the polymeric molecule by grafting reactions. Particular preference is given to binders which are soluble in organic solvents, since these binders usually exhibit only slight swelling with water-based printing inks or alcohol/water-based printing inks.

Particularly suitable elastomeric binders are thermoplastic elastomeric block copolymers made from alkenylaromatic compounds and 1,3-dienes. The block copolymers can be either linear block copolymers or radial block copolymers. They are usually three-block copolymers of the A-B-A type, but can also be two block polymers of the A-B type, or those having a plurality of alternating elastomeric and thermoplastic blocks, for example A-B-A-B-A. It is also possible to employ mixtures of two or more different block copolymers. Commercially available three-block copolymers frequently contain certain proportions of two-block copolymers. The diene units ay be 1,2- or 1,4-linked. They may also be fully or partially hydrogenated. It is possible to employ both block copolymers of the styrene-butadiene type and of the styrene-isoprene type. They are commercially available, for example, under the name KRATON®. It is also possible to employ thermoplastic elastomeric block copolymers containing terminal blocks of styrene and a random styrene-butadiene central block, which are available under the name STYROFLEX®.

The type and amount of binder employed are selected by the person skilled in the art depending on the desired properties of the relief layer. In general, an amount of from 45 to 95% by weight of binder, based on the amount of all constituents of the laser-engravable layer, has proven successful. It is also possible to employ mixtures of different binders.

In order to carry out the process according to the invention, an inorganic solid is added to the relief layer. The particle size of the solid added in accordance with the invention is from 1 to 400 nm. The particle size is preferably from 2 to 200 nm and particularly preferably from 5 to 100 nm. It is thus smaller than the wavelength of visible light. The laser-engravable layer containing the filler accordingly appears transparent. In the case of round or approximately round particles, the specification of the particle size relates to the diameter, while in the case of irregularly shaped, for example needle-shaped, particles, it relates to the longest axis. The term particle size is taken to mean the primary particle size. It goes without saying to the person skilled in the art that solid particles have a greater tendency toward agglomeration with decreasing primary particle size, and accordingly form larger secondary particles. For use in a certain matrix, they therefore usually have to be dispersed very intensively.

In particular, fillers having a specific surface area of from 30 to 300 $m^2/g$ and very particularly those having a specific surface area of from 100 to 200 $m^2/g$ have proven successful for carrying out the process according to the invention.

The fillers are generally colorless. However, the invention also covers the use of colored fillers for special applications, provided that the relief layer remains transparent and the photochemical crosslinking of the relief layer is not adversely affected thereby.

The added filler is selected from the group consisting of oxide, silicate and zeolite solids.

Examples of suitable fillers are finely divided glass microparticles, for example SPHERIGLAS® (Potters-Ballotini). Silicates which can be employed are, for example, finely divided bentonite or alumosilicates, such as finely divided feldspar.

Suitable oxide solids are, in particular, oxides or mixed oxides of the elements silicon, aluminum, magnesium, titanium or calcium. These may also contain additional dopants.

It goes without saying to the person skilled in the art that the finely divided inorganic solids always have certain amounts of water either adsorbed onto the surface or chemically bound. It is possible to employ oxides obtained by precipitation processes, for example precipitated silicic acid. Very particularly suitable are pyrogenic oxides, i.e. compounds obtained by thermal decomposition of suitable starting materials. In particular, pyrogenic silicon dioxides, pyrogenic aluminum oxides, pyrogenic aluminum-doped silicon dioxides or pyrogenic titanium dioxides can be employed. Oxides of this type are commercially available, for example, under the name AEROSIL® (Degussa). The fillers may also be coated with suitable dispersion aids, adhesion promoters or hydrophobicizing agents. It is also possible to employ mixtures of two or more fillers.

From 0.1 to 8% by weight of the finely divided filler are employed for the process in accordance with the invention. The amount data are based on the sum of all constituents of the laser-engravable relief layer. The layer preferably comprises from 0.2 to 5% by weight and very particularly preferably from 1 to 5% by weight of the filler.

The laser-engravable layer is photochemically crosslinked. For the photochemical crosslinking, monomeric or oligomeric compounds containing polymerizable groups are generally added to the laser-engravable recording layer. However, polymerizable or crosslinkable groups may also be constituents of the elastomeric binder itself, in which case they can be crosslinkable groups in the main chain, terminal groups and/or pendent groups. The monomers should be compatible with the binders and contain at least one polymerizable, olefinically unsaturated group. Monomers which have proven particularly advantageous are esters and amides of acrylic acid or methacrylic acid with monofunctional or polyfunctional alcohols, amines, aminoalcohols or hydroxyethers and -esters, styrene or substituted styrenes, esters of fumaric or maleic acid or allyl compounds. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide. It is also possible to employ suitable oligomers containing olefinic groups. It is of course also possible to employ mixtures of different monomers or oligomers, provided that these are compatible with one another. The total amount of any monomers employed is determined by the person skilled in the art depending on the desired properties of the recording layer. It depends, inter alia, on whether, for example, the polymeric binder itself already contains polymerizable groups. In general, however, 45% by weight, based on the amount of all constituents of the laser-engravable layer, should not be exceeded.

For the photochemical crosslinking, photoinitiators, for example benzoin or benzoin derivatives, such as α-methylbenzoin or benzoin ethers, benzil derivatives, for example benzil ketals, acylarylphosphine oxides, acylarylphosphinic esters and polycyclic quinones, can be employed in a known manner, without the list being restricted thereto. The crosslinking is carried out in a manner known per se by irradiation with actinic, i.e. chemically effective, radiation. Particularly suitable radiation is UV-A radiation having a wavelength of from 320 to 400 nm, or UV-A/VIS radiation having a wavelength of from 320 to about 700 nm. The type and amount of photoinitiator is determined by the person skilled in the art depending on the desired properties of the layer. He will, for example, ensure, on use of $TiO_2$ as filler, that an initiator which does not absorb below 415 nm is used. In general; the amount of photoinitiator is from 0.1 to 5% by weight.

The laser-engravable layer may additionally comprise plasticizers. Examples of suitable plasticizers are modified and unmodified natural oils and resins, alkyl, alkenyl, arylalkyl or arylalkenyl esters of acids, such as alkanoic acids, arylcarboxylic acids or phosphoric acid; synthetic oligomers or resins, such as oligostyrene, oligomeric styrene-butadiene copolymers, oligomeric α-methylstyrene-p-methylstyrene copolymers, liquid oligobutadienes, or liquid oligomeric acrylonitrile-butadiene copolymers; and polyterpenes, polyacrylates, polyesters or polyurethanes, polyethylene, ethylene-propylene-diene rubbers or α-methyloligo (ethylene oxide). Examples of particularly suitable plasticizers are paraffinic mineral oils; esters of dicarboxylic acids, such as dioctyl adipate or dioctyl terephthalate; naphthenic plasticizers or polybutadienes having a molecular weight of from 500 to 5000 g/mol. It is also possible to employ mixtures of different plasticizers. The amount of any plasticizer present is selected by the person skilled in the art depending on the desired hardness of the printing plate. It is generally less than 40% by weight, preferably less than 20% by weight and particularly preferably less than 10% by weight, based on the sum of all constituents of the photopolymerizable mixture.

The laser-engravable layer may in addition also comprise additives and auxiliaries, for example dyes, dispersion aids or antistatics. However, the amount of additives of this type should generally not exceed 10% by weight, based on the amount of all components of the crosslinkable, laser-engravable layer of the recording element.

The flexographic printing element employed as starting material may also have a plurality of laser-engravable layers one on top of the other. These laser-engravable, crosslinkable part layers may be of the same, approximately the same or different material composition. A multilayered structure of this type, particularly a two-layered structure, is sometimes advantageous since surface properties and layer properties can thus be changed independently of one another in order to achieve an optimum print result. The laser-engravable recording element may, for example, have a thin laser-engravable top layer whose composition has been selected with regard to optimum ink transfer, while the composition of the underlying layer has been selected with regard to optimum hardness or elasticity of the relief layer. It is essential to the invention that at least the uppermost layer comprises the filler mentioned. However, it is advisable for all layers to comprise the filler, at least all layers down to the maximum engraved relief depth.

The laser-engravable layer can be produced, for example, by dissolution or dispersion of all components in a suitable solvent and casting onto a support. In the case of multilayered elements, a plurality of layers can be cast one on top of the other in a manner known in principle. Alternatively, the individual layers can, for example, be cast onto temporary supports, and the layers subsequently bonded to one another by lamination. The laser-engravable recording elements are preferably produced in a manner known in principle by melt extrusion followed by calendering. Use can be made, for example, of twin-screw extruders. It is in principle known to the person skilled in the art what type of screws he has to employ in order to ensure a very uniform distribution of the filler in the material.

The thickness of the laser-engravable layer or of all layers together is generally from 0.1 to 7 mm. The thickness is selected at a suitable value by the person skilled in the art depending on the desired application of the printing plate.

The crosslinkable, laser-engravable flexographic printing element employed as starting material may optionally comprise further layers.

Examples of such layers include an elastomeric sub-layer of a different formulation which is located between the support and the laser-engravable layer(s) and which need not necessarily be laser-engravable. Sub-layers of this type enable the mechanical properties of the relief printing plates to be changed without affecting the properties of the actual printing relief layer.

So-called elastic sub-structures which are located beneath the dimensionally stable support of the laser-engravable recording element, i.e. on the side of the support facing away from the laser-engravable layer, serve the same purpose.

Further examples include adhesive layers, which bond the support to underlying layers or bond different layers to one another.

The laser-engravable flexographic printing element may, if desired, be protected against mechanical damage by a protective film, consisting, for example, of PET, which is located on the uppermost layer in each case, and which must in each case be removed before the laser engraving. The protective film may also be siliconized or provided with a suitable relief layer in order to simplify peeling off.

In a further process step, a printing relief is engraved into the crosslinked, laser-engravable layer by means of a laser. It is advantageous to engrave pixels in which the edges of the pixels. initially fall off vertically and only spread out in the lower region of the pixel. This results in a good shoulder shape of the image dots, but nevertheless low dot gain. However, it is also possible to engrave image dot edges of a different shape, for example a step-shaped relief.

Particularly suitable for laser engraving are $CO_2$ lasers having a wavelength of 10640 nm. The image information to be engraved is transferred directly from the layout computer system to the laser apparatus. The laser can be operated either continuously or in pulsed mode.

The finely divided fillers added, even in small amounts, cause a very significant improvement in the printing properties of the resultant printing plate. While, without addition of fillers, the laser-engravable layer still tends to melt under the influence of the laser radiation and melt edges are evident, addition of only 1% enables the melt edges to be completely eliminated. At the same time, the achievable resolution is significantly improved.

In general, the flexographic printing plate obtained can be employed directly. If desired, however, the flexographic printing plate obtained can subsequently be cleaned. A cleaning step of this type removes layer constituents which have been loosened, but have not yet been completely removed from the plate surface. In general, simple treatment with water or alcohols is entirely adequate.

The flexographic printing elements employed as starting material for laser engraving may also be exposed imagewise in a conventional manner by means of photographic negatives and developed without the filler content having an adverse effect on this process. This double utility enables particularly economical production.

The following examples are intended to explain the invention in greater detail.

General Procedure for Laser Engraving

The engraving experiments were carried out using a laser unit with rotating outer drum (ALE Meridian Finesse) fitted with a $CO_2$ laser with an output power of 250 W. The laser beam was focused on a diameter of 20 $\mu$m. The flexographic printing elements to be engraved were stuck to the drum using adhesive tape, and the drum was accelerated to 250 rpm (web velocity at the surface of the drum: 240 cm/s).

As test motif, inter alia two lines having a nominal width of 20 $\mu$m and separations of 20, 40 and 60 $\mu$m were engraved into the relief layer of the flexographic printing element using the laser beam. The actual line width obtained and the separation actually remaining between the engraved lines were evaluated. Furthermore, the engraving depth at a completely uncovered point was measured.

In a further engraving experiment, a complete test motif consisting of full-tone areas and various half-tone elements was engraved into the respective flexographic printing element. The quality of the flexographic printing plate obtained was assessed under the microscope.

COMPARATIVE EXAMPLE 1

A light-sensitive mixture comprising 78% by weight of an SIS block copolymer (KRATON® 1161), 12.5% by weight of acrylates, 1% by weight of photoinitiator and 8.5% by weight of auxiliaries was extruded in a twin-screw extruder at a material temperature of 130° C. and discharged through a slot die. The melt emerging from he die was introduced into the nip of a two-roll calender. The two rolls had been heated to 80° C. A PET film coated with adhesive lacquer was introduced, as base film, into the calender nip over the first calender roll, and a PET protective film was introduced over the other roll. The sandwich element obtained was cooled and cut to size.

After removal of the protective film, the photosensitive flexographic printing element obtained was crosslinked over the entire surface by exposure from the front for 30 minutes and exposure from the back for 30 minutes, in each case to UV-A light. The plate was transparent.

The plate was subsequently mounted as described above on the cylinder of the laser apparatus. Lines at said separations and test motifs were engraved and evaluated. The experimental results are shown in Table 1. FIG. 1 shows a photomicrograph of the resultant test motif.

EXAMPLE 1

The procedure was as in the comparative example, but 1% by weight (based on the sum of all components of the layer) of a finely divided pyrogenic silicon dioxide having a specific surface area of 160 $m^2/g$ and a mean primary particle size of from 10 to 20 nm (AEROSIL® R 8200, Degussa) was added as filler during production of the flexographic printing element.

The experimental results are shown in Table 1. FIG. 2 shows a photomicrograph of the resultant test motif.

EXAMPLES 2–3

The procedure was as in the comparative example, but the amounts of silicon dioxide stated in Table 1 were added as filler during production of the flexographic printing element. The experimental results are shown in Table 1.

The engraving results obtained show that the addition according to the invention of only 1% of filler already resulted in a drastic improvement in resolution. While in the case of the plate without filler lines at a separation of 20 $\mu$m can no longer be resolved at all and instead coincide to form a single line, the two lines can be resolved in the presence of 1% of $SiO_2$.

The figures show that the edges of the positive elements shown are significantly sharper if the filler is present. Without filler, dark melt droplets are evident at the edges, which are not present in the case of the plates filled in accordance with the invention.

The negative element can also be seen significantly better in the case of the filled plate.

TABLE 1

Results of the laser engraving experiments:

| No. | Filler | Amount [% by weight] | Engraving depth [μm] | Appearance | 20 μm separation 1st line [μm] | 20 μm separation 2nd line [μm] | 20 μm separation Separation [μm] | 40 μm separation 1st line [μm] | 40 μm separation 2nd line [μm] | 40 μm separation Separation [μm] | 60 μm separation 1st line [μm] | 60 μm separation 2nd line [μm] | 60 μm separation Separation [μm] |
|---|---|---|---|---|---|---|---|---|---|---|---|---|---|
| Cmp. | — | 0% | 400 | Thick melt edges | 67 | Only a single line, no longer any web | | 45 | 46 | 17 | 44 | 47 | 35 |
| 1 | Aerosil | 1% | 450 | OK, no melt edges | 35 | 35 | 5 | 35 | 37 | 25 | 37 | 39 | 43 |
| 2 | Aerosil | 3% | 360 | OK, no melt edges | 36 | 37 | 5 | 38 | 40 | 23 | 40 | 42 | 41 |
| 3 | Aerosil | 5% | 450 | OK, no melt edges | 35 | 37 | 9 | 38 | 35 | 23 | 36 | 42 | 40 |

We claim:

1. A process for the production of flexographic printing plates by laser engraving, comprising the following steps:

(a) application of at least one photochemically crosslinkable relief layer to a dimensionally stable support, where the relief layer comprises at least one elastomeric binder, a polymerizable compound, a photoinitiator or photoinitiator system, a finely divided filler, and a plasticizer (b) crosslinking of the relief layer over the entire surface by irradiation with actinic light, (c) engraving of a printing relief into the crosslinked relief layer by means of a laser, wherein the elastomeric binder is a thermoplastic, elastomeric block copolymer made from alkenylaromatic compounds and 1,3-dienes, wherein the filler is selected from the group consisting of pyrogenic silicon dioxide, pyrogenic titanium dioxide, pyrogenic aluminum oxide, pyrogenic aluminum-doped silicon dioxide an mixtures thereof having a particle size of from 1 to 400 nm and a specific surface area from 30 to 300 $m^{2/}g$ and the amount employed is from 0.2 to 5% by weight, based on the amount of all components of the relief layer, with the proviso that the relief layer is transparent.

2. A process as claimed in claim 1, wherein about 1% by weight of the filler is employed.

3. A process as claimed in claim 1, wherein the elastomeric binder is a styrene-butadiene block copolymer.

* * * * *